US011398434B2

(12) United States Patent
Kisu et al.

(10) Patent No.: US 11,398,434 B2
(45) Date of Patent: Jul. 26, 2022

(54) SEMICONDUCTOR DEVICE, AND METHOD FOR MANUFACTURING SEMICONDUCTOR DEVICE

(71) Applicant: Mitsubishi Electric Corporation, Tokyo (JP)

(72) Inventors: Koichiro Kisu, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 117 days.

(21) Appl. No.: 16/636,899

(22) PCT Filed: Sep. 20, 2017

(86) PCT No.: PCT/JP2017/033916
§ 371 (c)(1),
(2) Date: Feb. 5, 2020

(87) PCT Pub. No.: WO2019/058458
PCT Pub. Date: Mar. 28, 2019

(65) Prior Publication Data
US 2020/0273808 A1 Aug. 27, 2020

(51) Int. Cl.
*H01L 23/544* (2006.01)
*H01L 23/00* (2006.01)
(Continued)

(52) U.S. Cl.
CPC .......... *H01L 23/544* (2013.01); *H01L 23/562* (2013.01); *H01L 29/0623* (2013.01);
(Continued)

(58) Field of Classification Search
CPC . H01L 23/544; H01L 2223/544–54493; H01L 29/7811; H01L 29/7823;
(Continued)

(56) References Cited

U.S. PATENT DOCUMENTS 6,448,632 B1 * 9/2002 Takiar .................. H01L 23/544
257/659
6,949,434 B2 * 9/2005 Okabe .................... H01L 21/28
438/268

(Continued)

FOREIGN PATENT DOCUMENTS

JP      2008-004724 A    1/2008
JP      2011-258617 A    12/2011
JP      2013-229441 A    11/2013

OTHER PUBLICATIONS

An Office Action; "Notice of Reasons for Refusal", mailed by the Japanese Patent Office dated Jan. 26, 2021, which corresponds to Japanese Patent Application No. 2019-542869 and is related to U.S. Appl. No. 16/636,899; with English language translation.

(Continued)

*Primary Examiner* — Amar Movva
(74) *Attorney, Agent, or Firm* — Studebaker & Brackett PC

(57) ABSTRACT

A semiconductor device includes a semiconductor substrate, an effective region formed as a conductive section on the semiconductor substrate, an ineffective region formed as a non-conductive section on the semiconductor substrate, a wiring metal formed in the effective region, a metal section provided on an upper surface of the wiring metal and exposed to an outside, an identifying mark provided on the upper surface of the wiring metal and exposed to the outside, the identifying mark being spaced apart from the metal section, and an insulating body provided on the upper surface of the wiring metal and exposed to the outside, the insulating body being adjacent to the metal section and the identifying mark.

16 Claims, 3 Drawing Sheets

(51) Int. Cl.
  *H01L 29/06*  (2006.01)
  *H01L 29/739*  (2006.01)
(52) U.S. Cl.
  CPC .............................. *H01L 29/7397* (2013.01); *H01L 2223/54406* (2013.01); *H01L 2223/54433* (2013.01)
(58) Field of Classification Search
  CPC ..... H01L 29/063–0634; H01L 29/0619–0623; B81C 99/007
  See application file for complete search history.

(56) References Cited

U.S. PATENT DOCUMENTS

2007/0296091 A1 12/2007 Yoshida et al.
2011/0298081 A1* 12/2011 Ata ........................ H01L 24/05
 257/496

OTHER PUBLICATIONS

International Search Report; Written Opinion; and Notification of Transmittal of the International Search Report and the Written Opinion of the International Searching Authority, or the Declaration issued in PCT/JP2017/033916; dated Nov. 21, 2017.

* cited by examiner

SEMICONDUCTOR DEVICE, AND METHOD FOR MANUFACTURING SEMICONDUCTOR DEVICE

FIELD

The present invention relates to a semiconductor device and a method of manufacturing the semiconductor device.

BACKGROUND

The patent literature PTL 1 discloses techniques for providing a marking for use in identification on a surface of a semiconductor chip by using a wiring pattern or the like.

PRIOR ART

Patent Literature

[PTL 1] JP 2008-004724

SUMMARY

Technical Problem

An identifying mark may be formed on a semiconductor device so as to ensure traceability of the semiconductor device. In order to enhance visibility of the identifying mark, it is preferable to form the identifying mark in an effective region which is a portion where the current of the semiconductor device flows. However, in power semiconductor chips such as MOSFET, IGBT, diodes, and the like, the entire effective region is covered by a wiring metal such as aluminum so as to allow a large current to flow. Accordingly, in a power semiconductor chip, there is no room for an identifying mark to be provided using a wiring metal. If an identifying mark is formed in such a wiring metal, a section immediately below the identifying mark becomes an ineffective region where no current is allowed to flow, as a result of which a problem arises that miniaturization of a power semiconductor chip is hindered.

The present invention has been made to solve the above-identified problem and an object of the present invention is to provide a semiconductor device that has an identifying mark and is suitable for miniaturization and a method of manufacturing such a semiconductor device.

Means for Solving the Problems

A semiconductor device according to this invention includes a semiconductor substrate, an effective region formed as a conductive section on the semiconductor substrate, an ineffective region formed as a non-conductive section on the semiconductor substrate, a wiring metal formed in the effective region, a metal section provided on an upper surface of the wiring metal and exposed to an outside, an identifying mark provided on the upper surface of the wiring metal and exposed to the outside, the identifying mark being spaced apart from the metal section, and an insulating body provided on the upper surface of the wiring metal and exposed to the outside, the insulating body being adjacent to the metal section and the identifying mark.

A method of manufacturing a semiconductor device according to this invention includes forming an effective region and an ineffective region on a semiconductor substrate, where the effective region has a wiring metal that is exposed on a upper surface of the effective region and the ineffective region has an electric field relaxation structure that is formed on a upper surface of the ineffective region, forming an insulating body that covers a part of the wiring metal, and performing a plating process on the wiring metal exposed from the insulating body to form, on the effective region, a metal section that is in contact with the insulating body and an identifying mark that is in contact with the insulating body.

Other features of the present invention will be disclosed below.

Advantageous Effects of Invention

According to the present invention, since an insulating body and an identifying mark adjacent to the insulating body are formed on the wiring metal in the effective region, it is made possible to provide a semiconductor device that has the identifying mark and is suitable for miniaturization.

DESCRIPTION OF EMBODIMENTS

A semiconductor device and a method of manufacturing a semiconductor device according to embodiments will be described hereinbelow with reference to the drawings. The same or corresponding components are to be denoted by the same reference signs and redundant explanations thereof may be omitted.

Embodiment 1

Figure 1:
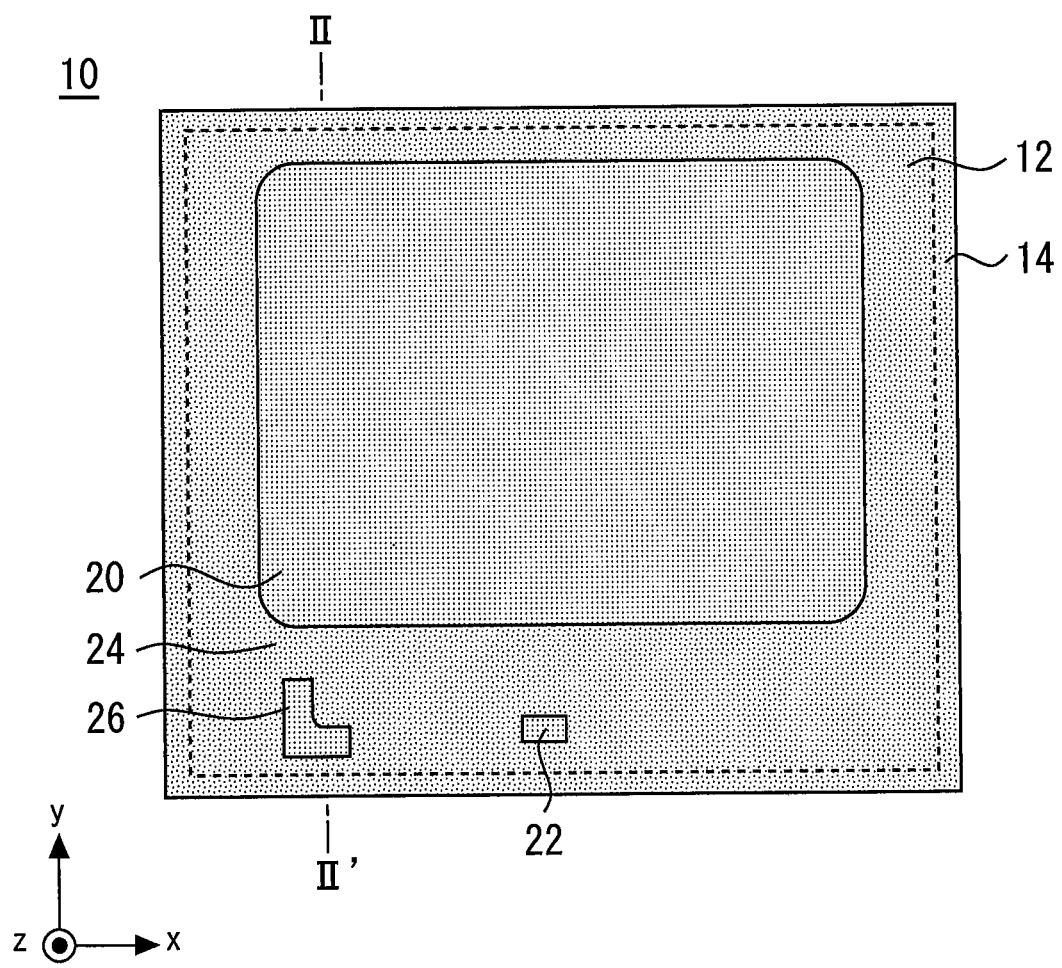
FIG. 1 is a plan view of a semiconductor device according to Embodiment 1.

FIG. 1 is a plan view of a semiconductor device 10 according to Embodiment 1. The semiconductor device 10 of Embodiment 1 is an IGBT chip. This semiconductor device 10 includes an effective region 12 which is a conductive section and an ineffective region 14 which is a non-conductive section. The broken line indicates the boundary between the effective region 12 and the ineffective region 14. When observed in the plan view, the ineffective region 14 encloses the effective region 12.

In the effective region 12, a metal section 20, a gate electrode 22, and an identifying mark 26 are formed. The metal section 20, the gate electrode 22, and the identifying mark 26 can be formed together by the same plating process. The metal section 20 is a soldering region where an electrode is soldered. For example, an emitter electrode is soldered to the metal section 20. The areas of the gate electrode 22 and the identifying mark 26 are smaller than that of the metal section 20. The identifying mark 26 has an L-shaped configuration.

The metal section 20, the gate electrode 22, and the identifying mark 26 are arranged to be adjacent to the insulating body 24. The insulating body 24 provides electrical insulation of the metal section 20, the gate electrode 22, and the identifying mark 26. The insulating body 24 can be made of polyimide, for example. Another material may be used to form the insulating body 24.

Figure 2:
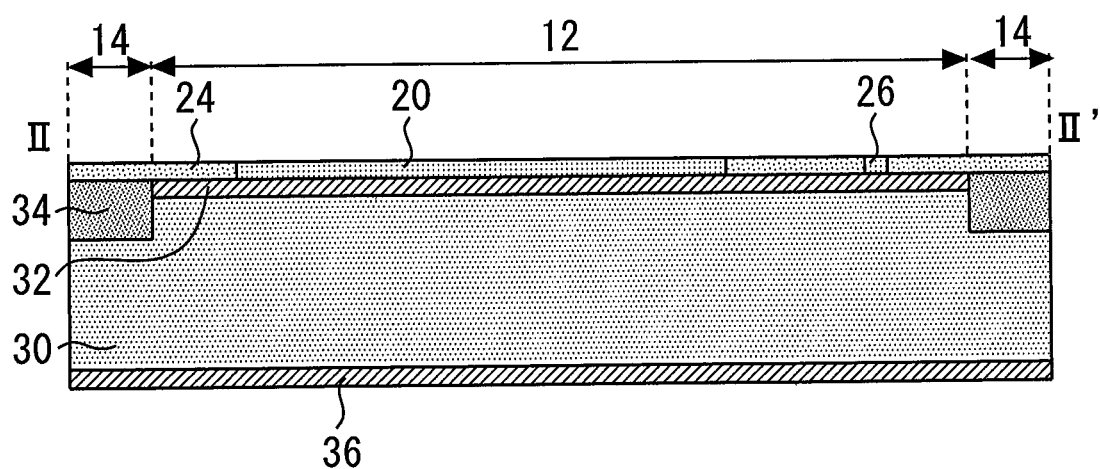
FIG. 2 is a sectional view of the semiconductor device taken along the dash-dot line H-IP of FIG. 1.

FIG. 2 is a sectional view of the semiconductor device 10 taken along the dash-dot line II-II' of FIG. 1. The semiconductor device 10 has a semiconductor substrate 30. Within the effective region 12, a wiring metal 32 is provided on the semiconductor substrate 30. If the semiconductor device 10 is a power semiconductor chip, then it is necessary to provide a wiring metal 32 having an area of a certain level to enable handling of a large current. In order to provide a large wiring metal 32 while avoiding increase in the size of the semiconductor device 10, it is preferable that the wiring metal 32 be formed on the entire surface of the effective region 12. In other words, the effective region 12 preferably includes no region that does not contribute to flowing of the current.

On the upper surface of the wiring metal 32, a metal section 20, an identifying mark 26 that is arranged to be spaced apart from the metal section 20, and an insulating body 24 are provided. The insulating body 24 is arranged to be adjacent to the metal section 20 and the identifying mark 26. Specifically, the sides of the metal section 20 and the identifying mark 26 are in contact with the insulating body 24. The metal section 20, the identifying mark 26, and the insulating body 24 are exposed to the outside.

The wiring metal 32, the metal section 20, and the identifying mark 26 can be made of at least one selected from the group consisting of Al, Al—Si, Al—Cu, and Al—Si—Cu. For example, whilst the wiring metal 32 can be made of Al—Si, the metal section 20 and the identifying mark 26 can be made of a material that contains aluminum.

In the ineffective region 14, on the upper side of the semiconductor substrate 30, an electric field relaxation structure 34 is formed. The electric field relaxation structure 34 provides relaxation of the electrical field of the semiconductor substrate 30 by stretching the depletion layer of the semiconductor substrate 30 and raises the withstand voltage of the semiconductor device 10. The electric field relaxation structure 34 can have, for example, a guard ring or resurf structure. On this electric field relaxation structure 34, an insulating body 24 is provided.

A collector electrode 36 is formed on the lower surface of the semiconductor substrate 30. The collector electrode 36 can be made of aluminum, for example. Typically, a buffer layer and a collector layer that provides holes in the semiconductor substrate 30 via the buffer layer are provided on the lower surface of the semiconductor substrate 30.

Figure 3:
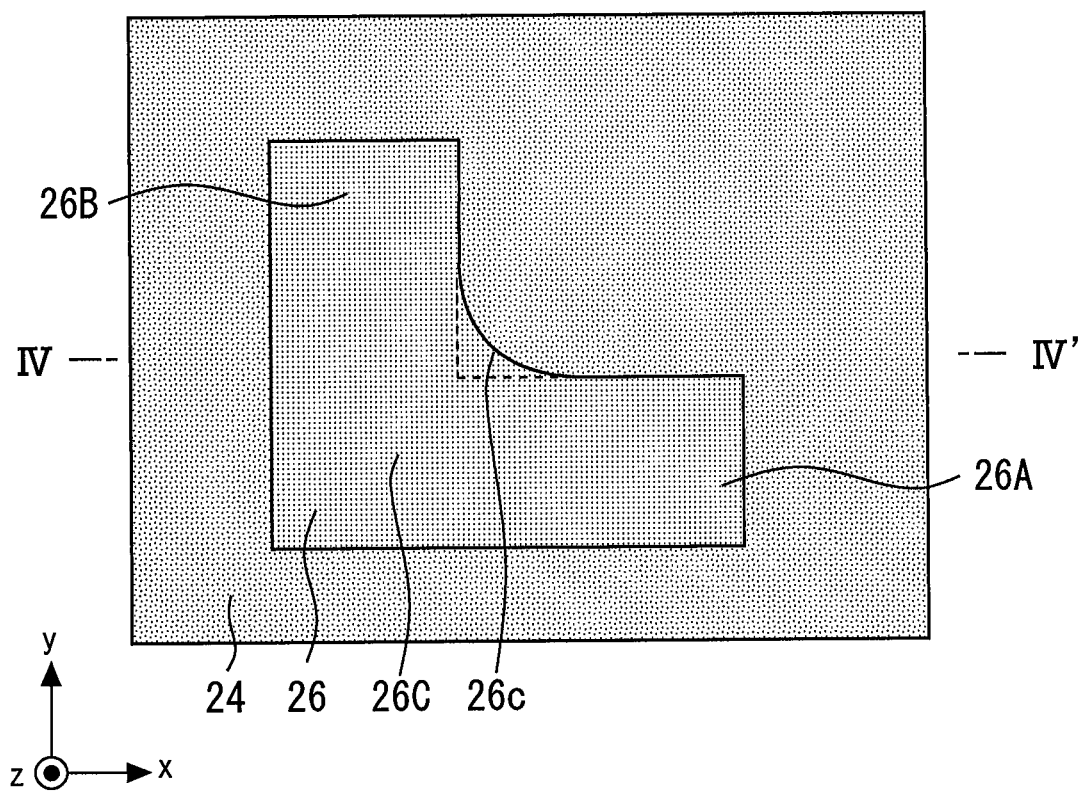
FIG. 3 is an enlarged view of the identifying mark.

FIG. 3 is an enlarged view of the identifying mark 26. The identifying mark 26 has, when observed in a plan view, linear sections 26A, 26B which are formed in a linear fashion and a bent section 26C. The bent section 26C connects the linear section 26A to the linear sections 26B. The bent section 26C has a convex profile on its outer side and a concave profile on its inner side. In addition, the outer edge 26c on the inner side of the bent section 26C defines a curve when the bent section 26C is observed in its plan view. By virtue of this curve, the linear sections 26A and 26B are connected to each other. Accordingly, the boundary between the inner side of the bent section 26C and the insulating body 24 will have a curved shape. By virtue of the outer edge 26c having the curved shape, the insulating body 24 in contact with the outer edge 26c is prevented from having a convex profile.

Figure 4:
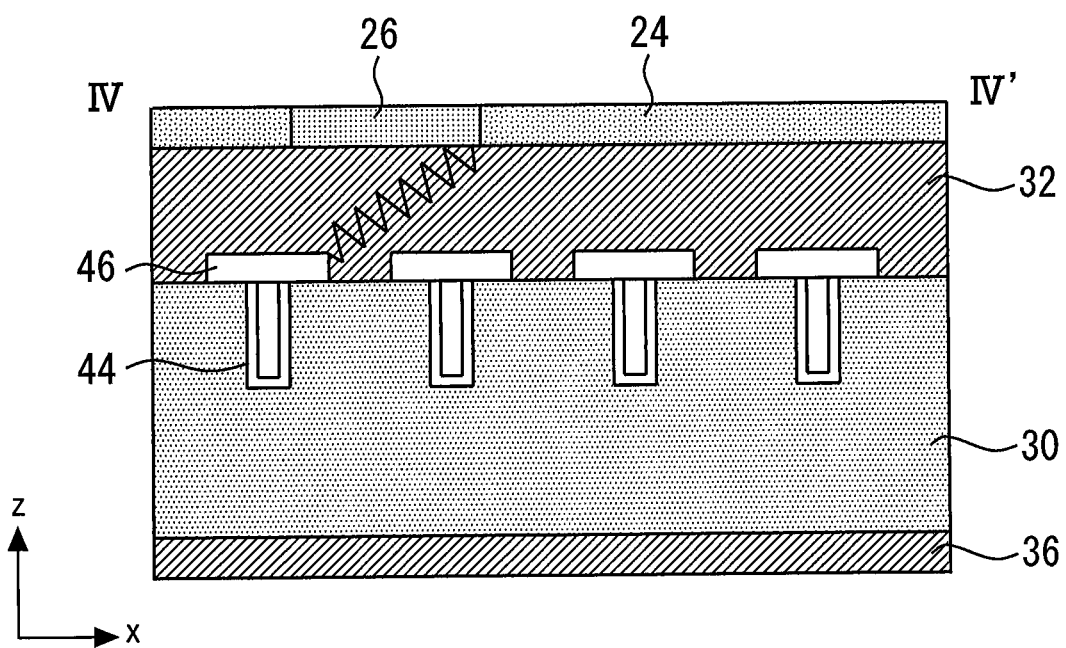
FIG. 4 is a view showing the crack.

The broken line in FIG. 3 indicates the case where the outer edge on the inner side of the bent section has a linear shape. In this case, the insulating body 24 may stretch into the bent section and, when the semiconductor substrate warps, a large stress is applied from the insulating body 24 to the bent section. As a consequence, a crack may be created in the identifying mark or below the identifying mark. An example of such a crack is illustrated in FIG. 4 which provides a sectional view. FIG. 4 is a sectional view taken along the dash-dot line IV-IV' of FIG. 3. FIG. 4 is a diagram depicted on the assumption that the bent section 26C of FIG. 3 has a shape indicated by the broken line. FIG. 4 illustrates a state where the inner side of the bent section is only formed of straight lines, as a result of which a crack has been created in the wiring metal 32. Such a crack degrades the reliability of the semiconductor device. For example, if the crack reaches the insulation film 46 which insulates the trench gate 44 from the wiring metal 32, then gate failure may result.

In contrast to this, as illustrated in FIG. 3, when the outer edge 26c is configured to have a curved shape, the stress acting from the insulating body 24 upon the bent section 26C at the time of warping of the semiconductor substrate 30 is deconcentrated and occurrence of a crack can be prevented.

A method of manufacturing a semiconductor device according to Embodiment 1 will be described below. First, the effective region having the wiring metal 32 exposed on its upper surface and the ineffective region having the electric field relaxation structure 34 on its upper surface side are formed on the semiconductor substrate 30. Subsequently, the insulating body 24 that covers a part of the wiring metal 32 is formed. More specifically, the insulating body 24 illustrated in FIG. 1 is formed. The insulating body 24 has openings where the metal section 20, the gate electrode 22, and the identifying mark 26 are to be formed. Accordingly, at this stage, the wiring metal 32 is exposed at the portions where the metal section 20, the gate electrode 22, and the identifying mark 26 are to be formed.

Subsequently, a plating process is performed on the wiring metal 32 exposed from the insulating body 24. This plating process is performed to form the metal section 20, the gate electrode 22, and the identifying mark 26 together on the effective region 12 using the insulating body 24 as a mask. The metal section 20, the gate electrode 22, and the identifying mark 26 are formed of the same material. The bottom surfaces of the metal section 20, the gate electrode 22, and the identifying mark 26 are in contact with the wiring metal 32 and their sides are in contact with the insulating body 24.

Before or after these processes, the lower surface of the semiconductor substrate 30 may be ground to reduce the thickness of the semiconductor substrate 30. In the case of a power semiconductor chip, the thickness of the semiconductor substrate 30 may be reduced to lower the on-state voltage and improve the switching characteristics. For example, in the case of a semiconductor device with 600-volt withstand voltage, the thickness of the semiconductor substrate 30 may be reduced to 100 µm or less. Grinding of the semiconductor substrate 30 is not essential. However, a thin semiconductor substrate 30 is likely to warp and cause the above-discussed crack, so that it is particularly effective to provide the outer edge 26c in the bent section 26C.

Figure 5:
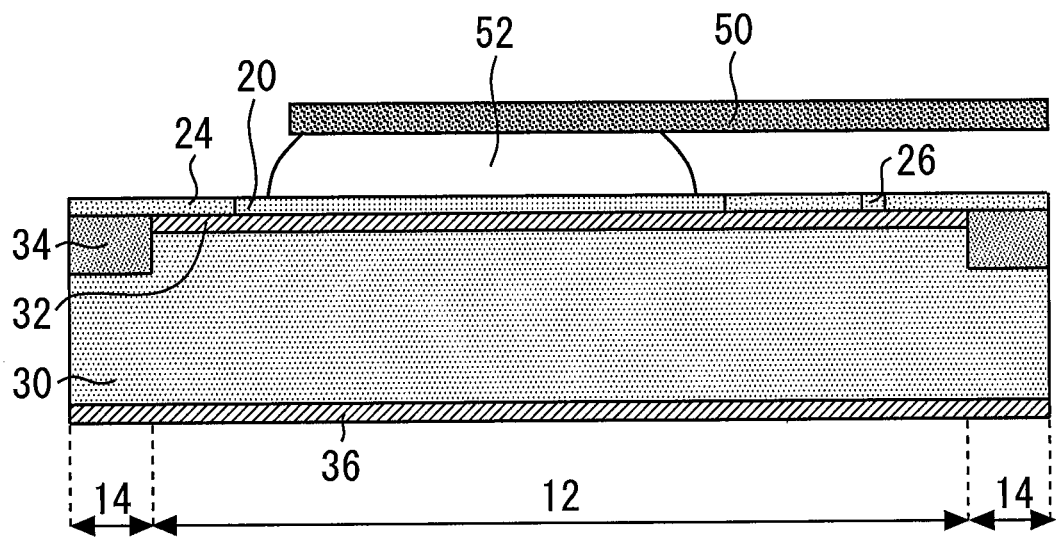
FIG. 5 is a diagram that illustrates the emitter electrode fixedly mounted to the semiconductor device.

FIG. 5 is a diagram that illustrates the emitter electrode 50 fixedly mounted to the semiconductor device 10. The emitter electrode 50 is soldered to the metal section 20 using the solder 52. When the metal section 20 is exposed at the large part of the effective region 12, the emitter electrode 50 can be soldered to the metal section 20 without increase in the size of the semiconductor device 10.

According to the semiconductor device according to Embodiment 1, since the identifying mark 26 is formed on the wiring metal 32, no increase in the ineffective region occurs due to the presence of the identifying mark 26. In other words, even when the identifying mark 26 is provided, the ineffective region is not created. In this manner, the semiconductor device 10 according to Embodiment 1 is allowed to be configured as a semiconductor device suitable for miniaturization by providing the identifying mark 26 while avoiding increase in the ineffective region.

If the identifying mark 26 is to be formed in the effective region 12, care should be taken to avoid creation of a crack due to the identifying mark 26 and the insulating body 24. In view of this, according to Embodiment 1, as has been discussed in the foregoing, the outer edge 26c of the inner side of the bent section 26C of the identifying mark 26 has a curved shape when it is observed in the plan view. By virtue of this, it is made possible to prevent a crack due to the stress acting from the insulating body 24 upon the identifying mark 26. It should be noted that it is also possible to adopt an identifying mark having a shape different than that shown in FIG. 1 and allow the identifying mark to have "an outer edge of the inner side of the bent section with a curved shape when it is observed in the plan view."

The semiconductor device and the method of manufacturing the semiconductor device according to Embodiment 1 can be modified within the range where their features are not lost. For example, while the semiconductor device 10 according to Embodiment 1 is provided as an IGBT chip, a well-known power semiconductor chip may also be provided as the semiconductor device. For example, a MOSFET or diode chip may be provided as the semiconductor device. It should be noted that the above-mentioned modifications can also be applied to the semiconductor device and the method of manufacturing the semiconductor device which will be described in the context of the following embodiment.

Embodiment 2

Figure 6:
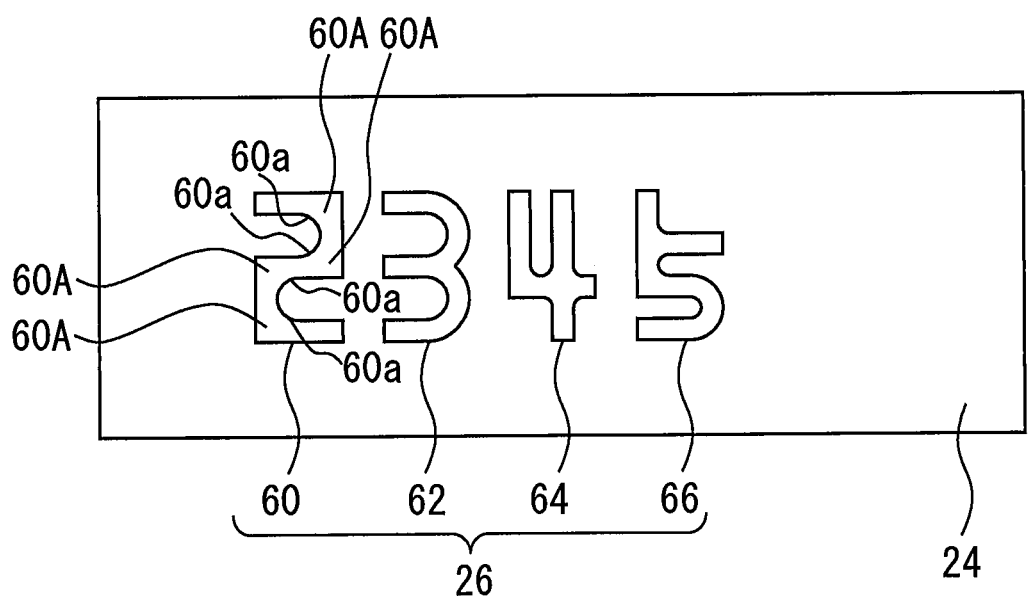
FIG. 6 is a plan view of the identifying mark of the semiconductor device according to Embodiment 2.

A semiconductor device and a method of manufacturing a semiconductor device according to Embodiment 2 only differ in the shape of the identifying mark from Embodiment 1. FIG. 6 is a plan view of the identifying mark 26 of the semiconductor device according to Embodiment 2. The identifying mark 26 includes identifying marks 60, 62, 64, and 66. The identifying mark 60, 62, 64, and 66 indicate 2, 3, 4, and 5, respectively. The outer edges of the inner sides of the bent sections of these figures have a curved shape when they are observed in the plan view. For example, the identifying mark 60 has four bent sections 60A. All of the outer edges 60a of these four bent sections 60A have a curved shape when they are observed in the plan view. In this manner, when the outer edges of the inner sides of the bent sections in various shapes of identifying marks are configured to have a curved shape when observed in the plan view, creation of a crack can be suppressed. It is also possible to adopt an identifying mark with a shape different than those shown in FIG. 6.

DESCRIPTION OF SYMBOLS 10 semiconductor device, 12 effective region, 14 ineffective region, 20 metal section, 24 insulating body, 26 identifying mark, 30 semiconductor substrate, 32 wiring metal

The invention claimed is:
1. A semiconductor device comprising:
a semiconductor substrate;
an effective region formed as a conductive section on the semiconductor substrate;
an ineffective region formed as a non-conductive section on the semiconductor substrate;
a wiring metal formed in the effective region;
a metal section provided on an upper surface of the wiring metal and exposed to an outside;
an identifying mark provided on the upper surface of the wiring metal, an entirety of an upper surface of the identifying mark being exposed to the outside, and the identifying mark including an outer edge having a curved shape in a plan view sufficient to deconcentrate stress to prevent cracking, the identifying mark being spaced apart from the metal section; and
an insulating body provided on the upper surface of the wiring metal and exposed to the outside, the insulating body being adjacent to the metal section and the identifying mark such that sides of the metal section and the identifying mark are in contact with the insulating body.
2. The semiconductor device according to claim 1, wherein
the metal section and the identifying mark are made of the same material.
3. The semiconductor device according to claim 2, wherein the ineffective region in the plan view encloses the effective region.
4. The semiconductor device according to claim 2, wherein the wiring metal is formed on an entire surface of the effective region.
5. The semiconductor device according to claim 1, wherein the insulating body is polyimide.
6. The semiconductor device according to claim 5, wherein the identifying mark has a bent section in the plan view and the outer edge is on an inner side of the bent section.
7. The semiconductor device according to claim 6, wherein the ineffective region in the plan view encloses the effective region.
8. The semiconductor device according to claim 6, wherein the wiring metal is formed on an entire surface of the effective region.
9. The semiconductor device according to claim 5, wherein the ineffective region in the plan view encloses the effective region.
10. The semiconductor device according to claim 5, wherein the wiring metal is formed on an entire surface of the effective region.
11. The semiconductor device according to claim 1, wherein the ineffective region in the plan view encloses the effective region.
12. The semiconductor device according to claim 11, wherein the wiring metal is formed on an entire surface of the effective region.
13. The semiconductor device according to claim 1, wherein the wiring metal is formed on an entire surface of the effective region.
14. A method of manufacturing a semiconductor device, the method comprising:
forming an effective region and an ineffective region on a semiconductor substrate, where the effective region has a wiring metal that is exposed on an upper surface of the effective region and the ineffective region has an electric field relaxation structure that is formed on a upper surface of the ineffective region;
forming an insulating body that covers a part of the wiring metal; and performing a plating process on the wiring metal exposed from the insulating body to form, on the effective region, a metal section that is in contact with the insulating body and an identifying mark that is in contact with the insulating body.

15. The method of manufacturing the semiconductor device according to claim 14, further comprising grinding a lower surface of the semiconductor substrate to reduce a thickness of the semiconductor substrate, wherein the insulating body is polyimide, and the identifying mark has a bent section in a plan view and an outer edge on an inner side of the bent section defines a curve in the plan view.

16. The semiconductor device according to claim 1, wherein an upper surface of the insulating body and the upper surface of the identifying mark are coplanar.

\* \* \* \* \*